(12) United States Patent
Goei et al.

(10) Patent No.: US 9,142,691 B2
(45) Date of Patent: Sep. 22, 2015

(54) REPLACEABLE SOLAR BULB ASSEMBLY FOR USE WITH A SOLAR RECEIVER ARRAY

(75) Inventors: Esmond T. Goei, Broomfield, CO (US); Yen Chin, Singapore (SG)

(73) Assignee: Aspect Solar PTE LTD, Singapore (SG)

( * ) Notice: Subject to any disclaimer, the term of this patent is extended or adjusted under 35 U.S.C. 154(b) by 387 days.

(21) Appl. No.: 13/455,900

(22) Filed: Apr. 25, 2012

(65) Prior Publication Data
US 2012/0268925 A1 Oct. 25, 2012

Related U.S. Application Data

(60) Provisional application No. 61/478,600, filed on Apr. 25, 2011.

(51) Int. Cl.
*H01R 13/627* (2006.01)
*H01L 31/02* (2006.01)
*H01L 31/048* (2014.01)
*H01L 31/052* (2014.01)
*H01L 31/054* (2014.01)
*H01R 13/187* (2006.01)
*H01R 101/00* (2006.01)

(52) U.S. Cl.
CPC ........ *H01L 31/02008* (2013.01); *H01L 31/048* (2013.01); *H01L 31/0521* (2013.01); *H01L 31/0547* (2014.12); *H01R 13/187* (2013.01); *H01R 13/6277* (2013.01); *H01R 2101/00* (2013.01); *Y02E 10/52* (2013.01)

(58) Field of Classification Search
CPC . H01L 31/0522; H01L 31/048; H01L 31/052; H01L 31/058; H01L 31/0422; H01L 31/042; H01L 31/0525; H01L 31/05; H01L 31/022425; H01L 2924/00014; H01L 31/0527; H01L 31/0524; H01L 27/1423; H01L 35/30; H01L 31/035281
USPC ........................................................ 136/246
See application file for complete search history.

(56) References Cited

U.S. PATENT DOCUMENTS

| 4,884,017 | A | * | 11/1989 | Williams ...................... 320/102 |
| 5,244,406 | A | * | 9/1993 | Vranish ........................ 439/362 |
| 6,799,742 | B2 | * | 10/2004 | Nakamura et al. ......... 244/172.7 |
| 8,329,503 | B1 | * | 12/2012 | Nielson et al. .................. 438/98 |
| 2004/0196657 | A1 | * | 10/2004 | Burton ......................... 362/273 |
| 2007/0070531 | A1 | * | 3/2007 | Lu ................................. 359/851 |

(Continued)

FOREIGN PATENT DOCUMENTS

EP 2221553 A2 8/2010
WO 2009032920 A2 3/2009

OTHER PUBLICATIONS

PCT: International Search Report and Written Opinion of PCT/US2012/035001 (counterpart application); Nov. 30, 2012, 9 pgs.

*Primary Examiner* — Anh Mai
*Assistant Examiner* — Fatima Farokhrooz
(74) *Attorney, Agent, or Firm* — Howison & Arnott, LLP (57) ABSTRACT

A replaceable solar bulb assembly generates electrical energy that includes a photo voltaic cell for converting solar energy into electrical energy. A housing includes at least one reflector for focusing the solar energy on the photo voltaic cell. A connector removably and mechanically connects the housing to a solar receiver array and electrically connects the photo voltaic cell to the solar receiver array.

14 Claims, 6 Drawing Sheets

(56) References Cited

U.S. PATENT DOCUMENTS

| | | |
|---|---|---|
| 2007/0215198 A1 | 9/2007 | Jiang et al. |
| 2008/0083450 A1* | 4/2008 | Benoit et al. .................. 136/246 |
| 2009/0183762 A1* | 7/2009 | Jackson et al. ................. 136/246 |
| 2009/0235973 A1* | 9/2009 | Thomasson .................... 136/246 |
| 2010/0012111 A1 | 1/2010 | Chen et al. |
| 2010/0032016 A1* | 2/2010 | Gee et al. ....................... 136/259 |

* cited by examiner

REPLACEABLE SOLAR BULB ASSEMBLY FOR USE WITH A SOLAR RECEIVER ARRAY

CROSS-REFERENCE TO RELATED APPLICATIONS

This application claims benefit of U.S. Provisional Application No. 61/478,600, filed Apr. 25, 2011, and entitled SYSTEM OF REPLACEABLE BULBS OF CONCENTRATOR PHOTO-VOLTAIC (CPV) SOLAR CELL(S) THAT ARE MOUNTED INSIDE A HERMETICALLY SEALED CASE EQUIPPED WITH A SOLAR ENERGY AMPLIFICATION MECHANISM SUCH AS A FRESNEL LENS OR PARABOLIC MIRROR TO MAGNIFY THE SUN'S RAYS ONTO THE CELL(S) WHICH GENERATES ELECTRICITY THAT IS EXTRACTED VIA BUILT-IN CONNECTORS THAT EXTENDS OUT OF THE BULB, the specification of which is incorporated herein by reference.

TECHNICAL FIELD

The present invention relates to photovoltaic solar arrays, and more particularly, to replaceable solar bulb assemblies that may be removed and replaced from photovoltaic solar arrays when the solar bulb assembly fails without completely replacing the array.

BACKGROUND

An array of concentrator photovoltaic (CPV) solar receiver arrays includes a plurality of receiver assemblies arranged in an X by Y array for receiving the Sun's energy and converting it into electricity. Within current designs, when any particular CPV receiver assembly becomes defective, there is no way to replace the individual receiver assembly. Thus, the only options for solving the problem of a defective assembly are leaving the defective assembly within the array such that the overall electrical energy generated by the array is reduced by the amount of the one receiver, or alternatively, the entire array would have to be replaced. This is due to the fact that current designs for CPV solar energy receivers do not allow for the ready replacement of defective receivers within an array on an individual receiver assembly basis. Thus, there is a need for a design of a CPV solar bulb assembly that enables the assemblies within an array to be individually replaced when the assemblies become defective and cease to function.

SUMMARY

The present invention as disclosed and described herein, comprises, in one aspect thereof, a replaceable solar bulb assembly for generating electrical energy that includes a photo voltaic cell for converting solar energy into electrical energy. A housing includes at least one reflector for focusing the solar energy on the photo voltaic cell. A connector removably and mechanically connects the housing to a solar receiver array and electrically connects the photo voltaic cell to the solar receiver array.

BRIEF DESCRIPTION OF THE DRAWINGS

For a more complete understanding, reference is now made to the following description taken in conjunction with the accompanying Drawings in which.

DETAILED DESCRIPTION

Referring now to the drawings, wherein like reference numbers are used herein to designate like elements throughout the various views and embodiments of a replaceable solar bulb assembly for use with a solar receiver array are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Figure 1:
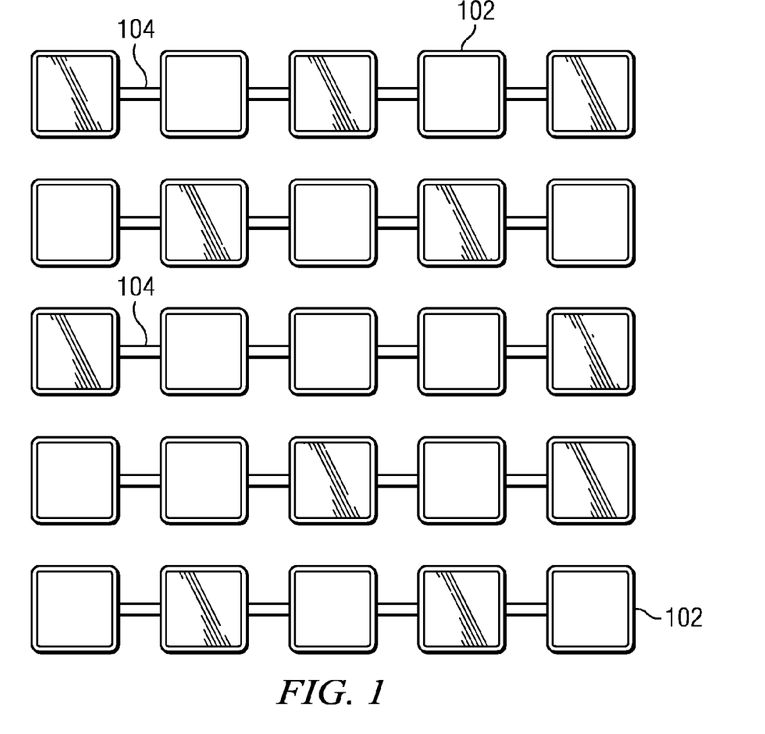
FIG. 1 is an illustration of an array of concentrator photovoltaic (CPV) solar bulb assemblies.

Referring now the drawings, and more particularly to FIG. 1, there is illustrated an example of a five by five grid array of CPV solar bulb assemblies 102 mounted upon associated support rails 104 of the array assembly. The array assembly can consist of any number of CPV solar bulb assemblies wherein the support rails 104 may be any desired length to add any desired number of CPV solar bulb assemblies 102, and multiple support rails 104 can be stacked with each other to provide any desired number of rows or columns. While the present figure illustrates an X by Y array in a single plane, other configurations by be used with the replaceable bulb assemblies. Other possible configurations include arrays occurring in multiple planes or arrays comprising randomly placed bulbs that are synchronized to point at the same direction of the sun rather than symmetrical X by Y arrays. As discussed previously, in prior embodiments, when one of the CPV solar bulb assemblies ceases to function, the only solution for repairing the defective assembly has been to replace the entire array or merely ignore the defective assembly and have a solar receiver array that generates less than the optimal amount of electrical energy.

Figure 2:
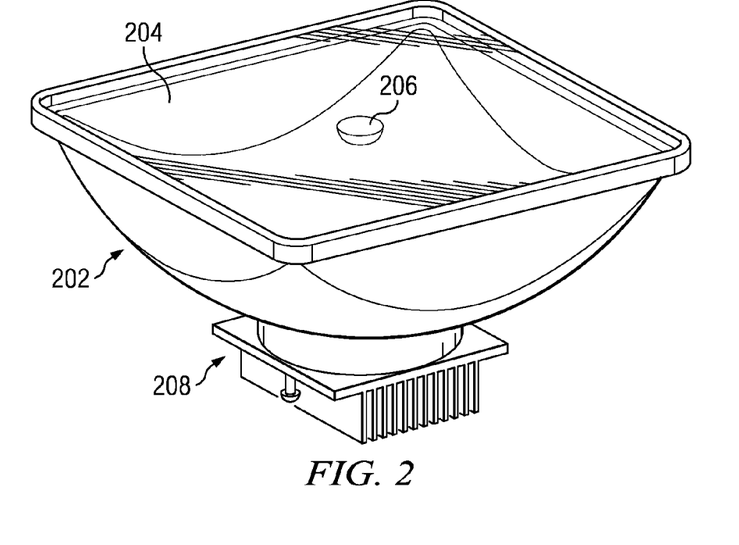
FIG. 2 is an illustration of a CPV solar bulb assembly.

Referring now to FIG. 2, there is illustrated one embodiment of a CPV solar bulb assembly. While the present implementation illustrates a square CPV solar bulb assembly, it should be realized that the assembly may be of any shape including circular, oval, rectangular, octagonal, etc., depending on the design needs and requirements of the solar array that is being designed. The CPV solar bulb assembly includes a primary reflector housing 202 that reflects the Sun from the interior surface 204 to a secondary reflector 206. The secondary reflector 206 concentrates the solar energy onto a concentrator photovoltaic cell within a sub-mount assembly 208. The sub-mount assembly 208 holds the photovoltaic cell (not shown) and provides a manner for mechanically and electrically connecting the CPV solar bulb assembly to the solar receiver array such as that illustrated in FIG. 1. The connection enables the assembly 208 to be easily removed and replaced in the array.

The secondary reflector 206 is supported within a transparent cover covering the open surface of the primary reflector housing 202. This maintains the secondary reflector 206 in a position to receive solar energy from the primary reflector surface 204 and concentrate it on the photovoltaic cell within the sub-mount assembly 208. The transparent cover additionally protects the interior reflector surface 204 of the primary reflector housing 202 from environmental and other external elements. The sub-mount assembly 208 consisting of the CPV cell (not shown) and a substrate that provides for mechanical support of the CPV cell as well as electrical connection to the CPV cells. The sub-mount assembly 208 also includes a heat sink for dissipating heat from the bulb assembly. Other configurations for the sub-mount assemblies 208 are possible, which may comprise other methods of heat dissipation from the cells other than a passive heat sink as shown in the following description.

Figure 3A:
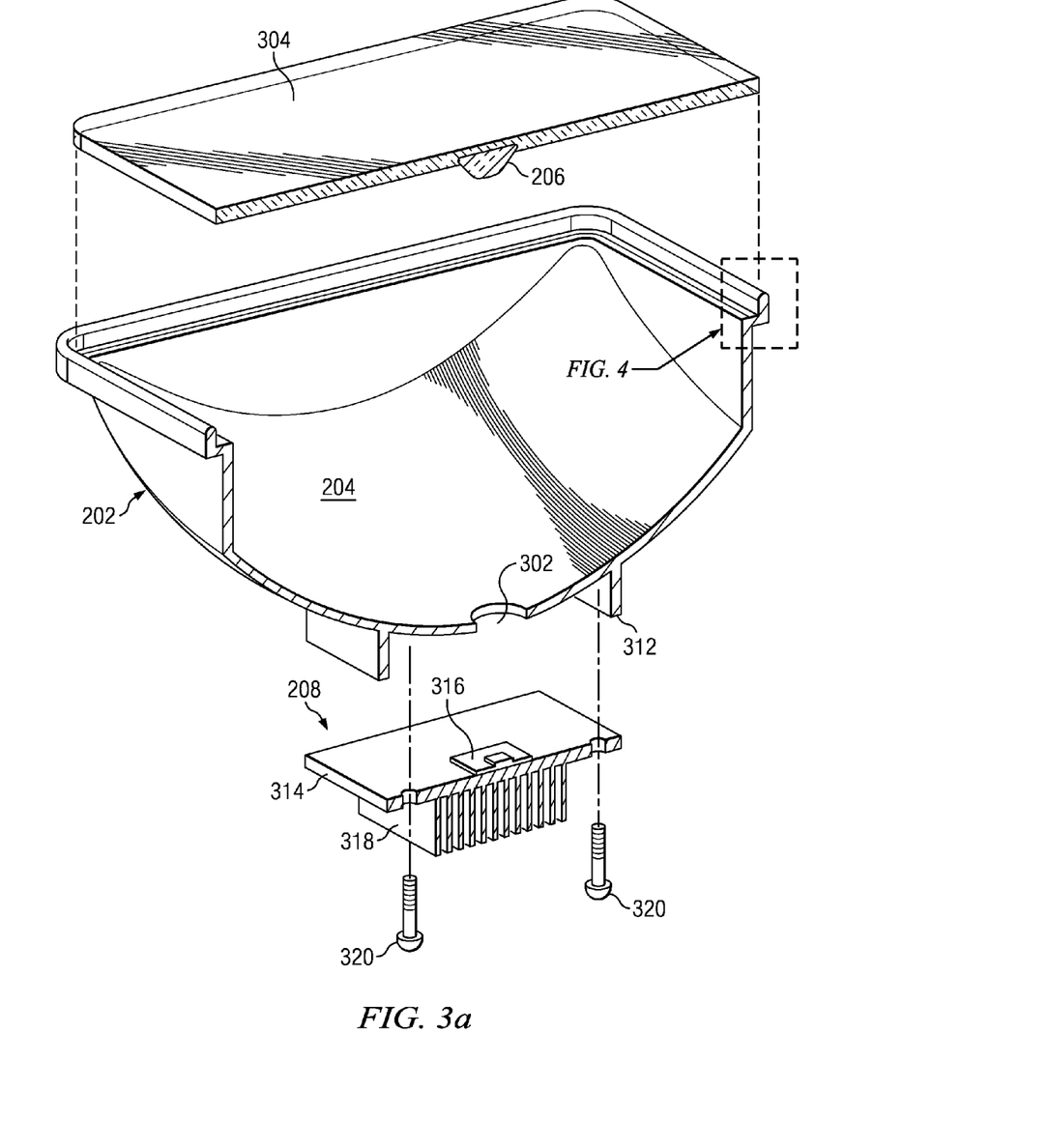
FIG. 3a is a cutaway exploded view of a CPV solar bulb assembly.

Referring now to FIG. 3a, there is illustrated a cutaway, exploded view of a CPV solar bulb assembly. The primary reflector housing 202 includes the interior reflective surface 204 that receives sunlight and reflects it upward to a secondary reflector 206. The primary reflector housing 202 may be made of numerous materials such as aluminum or even formed composites. The secondary reflector 206 receives the reflected sunlight from the primary reflector 204 and reflects it down to a hole 302 beneath which the concentrator photovoltaic cell lies for receiving the solar energy. The secondary reflector 206 is suspended within a transparent cover 304 that supports secondary reflector 206 over the hole 302 and protects the interior of reflective surface 204 of the primary reflector housing 202 from weather and other external elements. Other structures for supporting the secondary reflector 206 may also be used.

Figure 4:
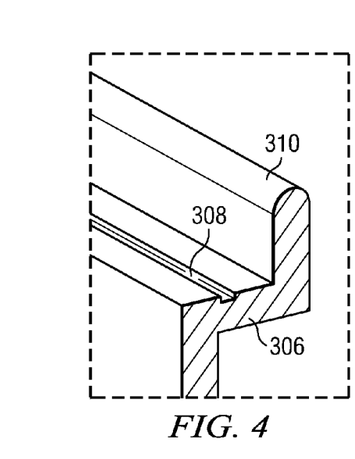
FIG. 4 illustrates the sealing edge for the housing of the CPV solar bulb assembly.

Referring now more particularly to FIG. 4, there is illustrated the support ledge and built-in channel of the primary reflector housing 202 for receiving an edge of the transparent cover 304 for providing a seal between the transparent cover and the primary reflector housing 202. The support ledge consists of a horizontal portion 306 on which the bottom edge of the transparent cover 304 rests. A protrusion within the bottom edge of the transparent cover rests within a channel 308 defined on the surface of the horizontal ledge 306. The protrusion of the transparent cover 304 rests within the channel 306 and provides a seal between the interior of the primary reflector housing 202 and the external environment. A vertical ledge 310 rests on a side edge of the transparent cover 304 to securely hold the transparent cover 304 within the primary reflector housing 202.

The base wall 312 provides for thermal interconnection between the subassembly 208 and the primary reflector housing 202. The subassembly 208 consists of a mounting plate 314 that provides support for the CPV photovoltaic cell 316. Connected to the bottom of the base plate 314 is the heat sink 318. The base plate 314 can also be formed as a part of the heat sink 318. The heat sink 318 dissipates heat that is generated by the solar energy falling on the main reflector assembly 202 and also directly on the solar cell 316 which directly heats up the base plate 314 and heat sink 318. The heat sink 318 may alternatively be formed as part of the housing 202. A pair of metal connectors 318 connect the subassembly 208 to the primary reflector housing 202. Additionally, these metal connectors 320 will conduct electricity from the solar cell 316 to electrical contacts housed in connector blocks 510.

Figures 3B, 3C, 3D:
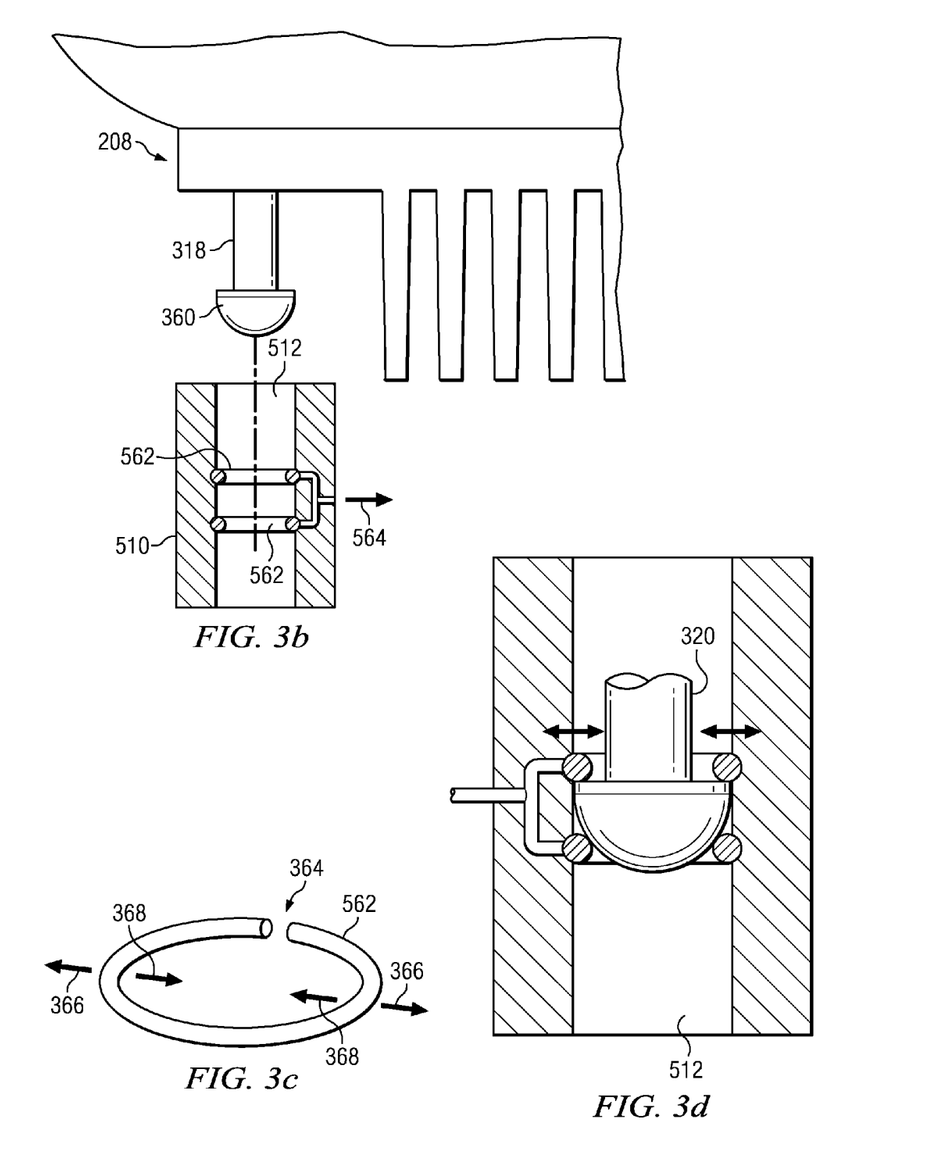
FIG. 3b illustrates the components for mechanically and electrically connecting a subassembly with a block connector.
FIG. 3c illustrates the spring contact of the electrical block.
FIG. 3d illustrates the electrical connector of a subassembly inserted within the spring contacts of the connector block.

Referring now to FIGS. 3b-3d, there are more fully illustrated the manner in which the metal connector 318 will engage the connector block 510 and secure the subassembly 208 to the rest of the solar array both mechanically and electrically. FIG. 3b illustrates the subassembly 208 prior to insertion of the metal connector 318 into the slot 512 of the connector block 510. As can be seen, the metal connector 318 includes a rounded head 360 that will fit within the slot 512 and engage a pair of spring contacts 562. The spring contacts 562 are electrically connected to an output line 564 that provides electrical power provided from the subassembly 208 to the cables 514 of the solar array.

Referring now also to FIG. 3c, there is illustrated a view of the spring contacts 562. The spring contacts 562 comprise an electrically conductive material, in a preferred embodiment, some type of metal, in a circular configuration having a slot 364 defined therein. The spring contact 562 material is flexible enabling the spring to flex outward when the rounded head 360 of the metal connector 318 is forced into contact therewith. When the rounded head 360 contacts the spring contact 562, the rounded head will force the contact outward in the direction indicated generally by arrows 366. After the rounded head 360 has passed by, the spring contact 562 will snap back into place as indicated generally by the arrows 368 to provide a secure connection to the metal connector 318. Electrical energy provided by the subassembly 208 will flow out of the electrical connector 318 to the spring contacts 562 and out of the electrical output line 564. The spring contact 562 provides both mechanical interconnection between the subassembly 208 and the connector block 510 while further providing for the ability to transmit electrical energy between the subassembly 208 and connector block 510. The fully inserted connection between the electrical connector 318 and the spring contacts 562 of the connector block is more fully illustrated in FIG. 3d.

Figure 5:
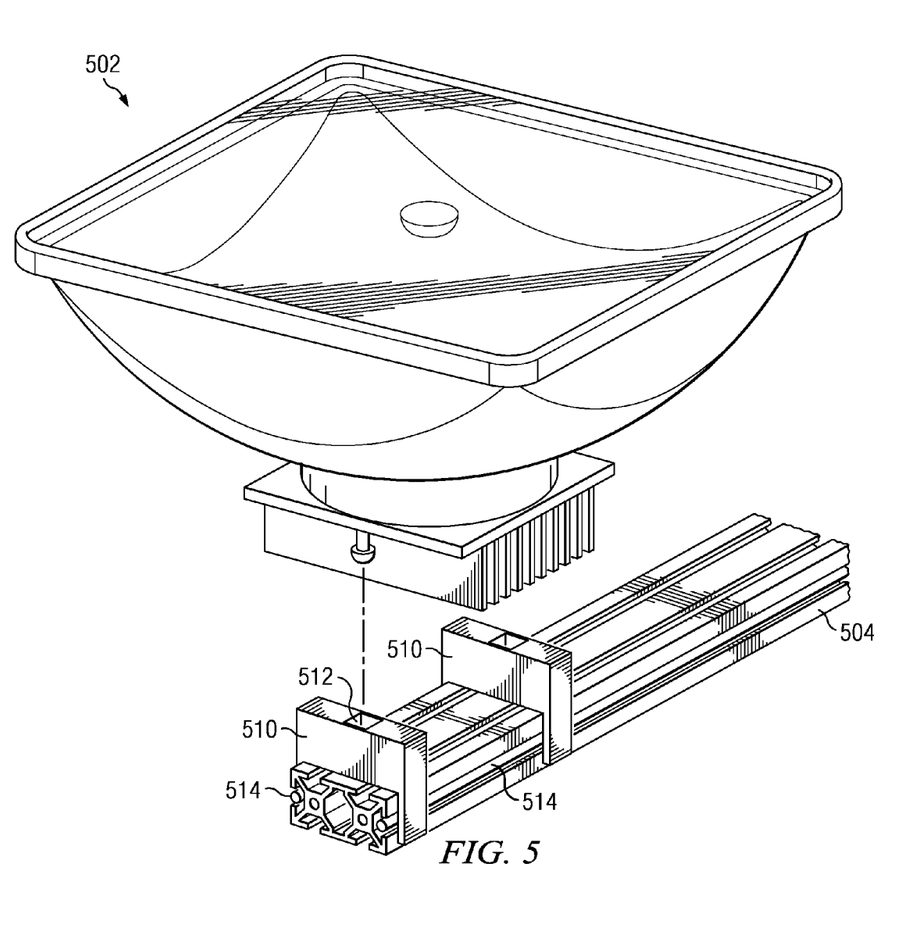
FIG. 5 illustrates the manner in which the CPV solar bulb assembly may interconnect with a docking mechanism upon an array support structure.
Figure 6:
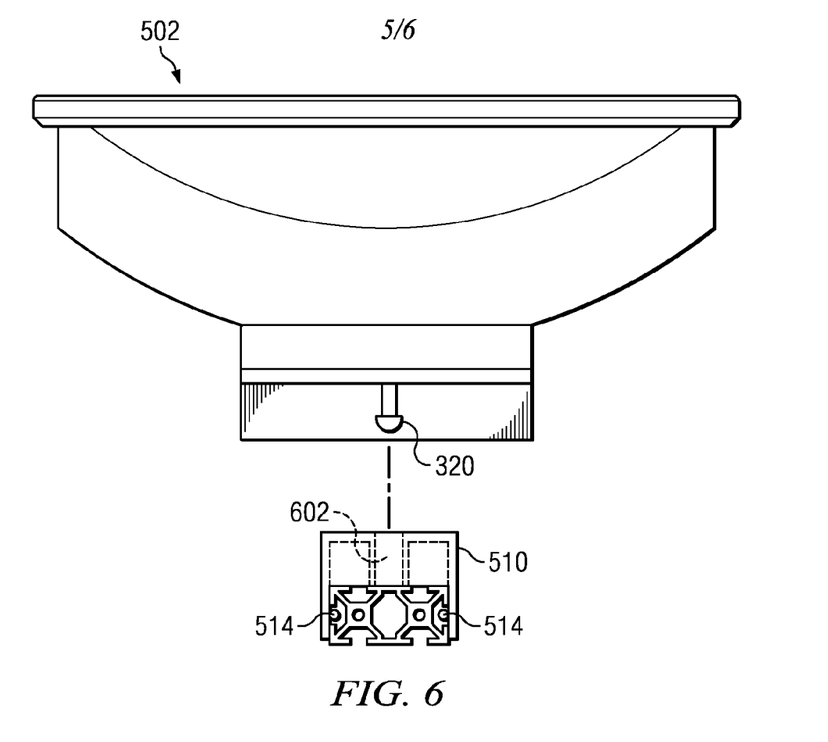
FIG. 6 is a side view of a CPV solar bulb assembly and the support rails for connecting the bulb assembly to a solar receiver array.

Referring now to FIGS. 5 and 6, there is illustrated the solar bulb assembly 502 and support rail 504. FIG. 5 illustrates a CPV solar bulb assembly 502 that has not yet been connected to the array structure. The solar receiver array 504 includes a support rail 504 for holding the solar bulb assemblies 502 and aligning them within an array. A pair of connector blocks 510 are positioned to receive the heat sink between them, and the metal connectors 320 are inserted within a slot 512 within the connector blocks 510. The connector blocks 510 are placed apart a predetermined distance in order to receive the heat sink 318 of the CPV solar bulb assembly 502. The connector blocks 510 provide for electrical power transmission and structural support of the CPV solar bulb assembly 502. The connector blocks 510 are electrically connected to cables 514 within the rail 504.

Figure 7:
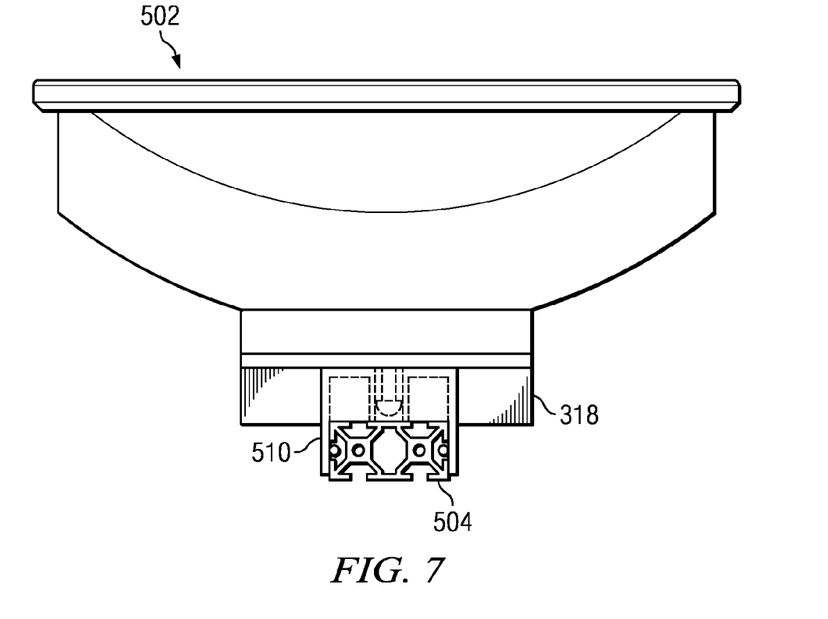
FIG. 7 illustrates a CPV solar bulb assembly inserted within a docking station of a solar receiver array.

The illustration in FIG. 6 shows how the metal connector 320 may be inserted down in the slot 512 within the connector 510. FIG. 6 also more fully illustrates the power transmission cables 514. Each of these cables 514 are connected to receive the electrical power generated by the concentrator photovoltaic circuit within the CPV solar bulb assembly 502. This is more fully illustrated in FIG. 7, which shows the CPV solar bulb assembly 502 connected to the support rail 504. The metal connector 320 is inserted into the slot 602 to mechanically and electrically connect the CPV solar bulb assembly to the connectors 510. The heat sink 318 is inserted between each of the connectors 510 to further provide structural support therefor. The CPV solar bulb assembly is seated flush with the rail 504 and electrically connected to the connectors 510, which transmit electricity down the rail 504 to join with other modules within the array.

Figure 8:
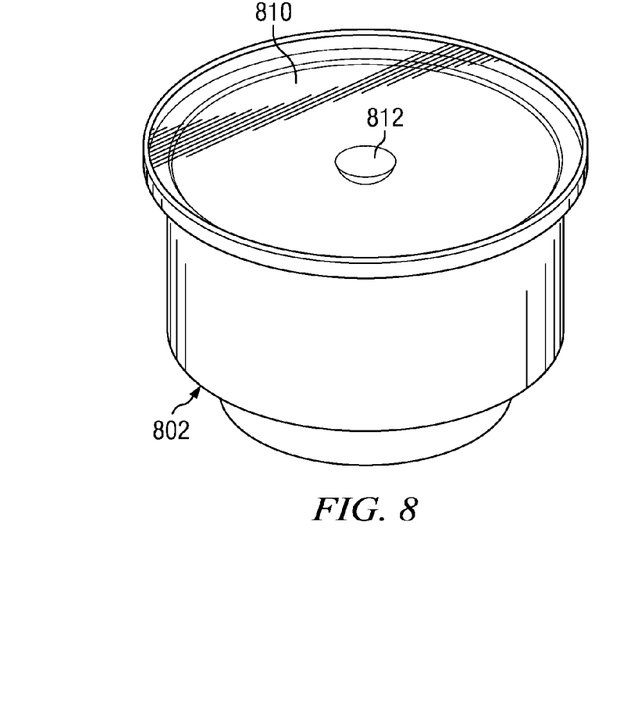
FIG. 8 illustrates an alternative embodiment of a CPV solar bulb assembly.
Figure 9:
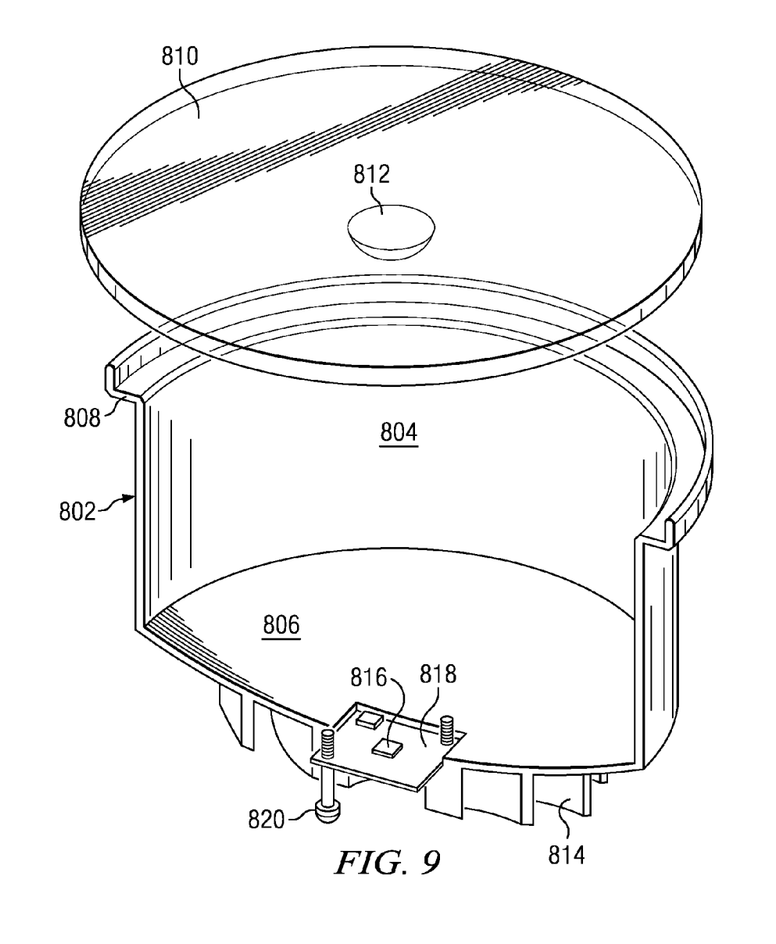
FIG. 9 is a cutaway view of the CPV solar bulb assembly of FIG. 8.

Referring now to FIGS. 8 and 9, there are illustrated an alternative embodiment of the CPV solar bulb assembly wherein the primary reflector housing 802 includes a surrounding wall 804 integrally formed with an edge of a primary reflector 806. The top edge of the surrounding wall 804 defines a ledge 808 for supporting a transparent cover 810 within the center of the transparent cover 810 is the secondary reflector 812. The transparent cover 810 environmentally seals the interior of the solar bulb assembly.

The housing 802 may include a built-in or attached heat sink 814. The heat sink 814 enables the removal of heat energy caused from the sun radiating upon the solar cell 816 mounted on a support plate 818. The quick connect bolts 820 connect to the bottom of the housing 802 providing electrical contacts between the CPV cell 816 and the energy cable upon the various support rods discussed previously. The bolts 820 electrically connect the solar cell to electrical sockets providing for energy transport.

Using the configuration described hereinabove, the design enables users to provide an assembly of variable size arrays of CPV solar bulb assemblies by merely plugging in the desired number of CPV solar bulb assemblies to achieve a desired level of power generation. The Arrays may comprise a variety of configurations including a single plane X by Y array or arrays occurring in multiple planes. The arrays may also comprise randomly placed bulbs that are synchronized to point at the same direction of the sun rather than symmetrical X by Y arrays. Additionally, this system provides for easy maintenance of the array of solar bulb assemblies by simply unplugging a defective bulb and replacing it with a good bulb. By standardizing the bulb design, volume runs can be made, which reduces the individual costs of the bulbs which can be easily shipped and stored for future use. Utilizing the bulb design reduces the waste resulting from replacing a complete array of CPV cell solar bulb systems which become inoperative due to a single non-performing CPV cell. Using these bulbs, only the defective bulb needs to be replaced while the frame socket need not be removed.

It will be appreciated by those skilled in the art having the benefit of this disclosure that this replaceable solar bulb assembly for use with a solar receiver array provides for better maintenance of the array when the bulb assembly becomes defective. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A single replaceable solar bulb assembly for installation in a solar receiver array including a plurality of replaceable solar bulb assemblies, comprising:
    a photo voltaic cell for converting solar energy into electrical energy;
    a housing including at least one reflector for containing the photo voltaic cell within the housing as a single removable unit and for focusing the solar energy on the photo voltaic cell; and
    a connector for removably and mechanically connecting the single removable unit including the housing containing the photovoltaic cell to the solar receiver array and electrically connecting the photo voltaic cell to the solar receiver array, wherein the connector selectively connects the single removable unit including the housing containing the photovoltaic cell to the solar receiver array independently of other replaceable solar bulb assemblies, the connector comprising:
        at least one metal post extending from the housing having a first end connected to the housing and a second end, the second end defining a half sphere having a curved surface facing away from the housing and a second flat surface facing toward the housing; and
        a pair of split ring spring contacts, the first split ring spring contact opening to receive the second end of the metal post responsive to the half sphere pressing against the first split ring, wherein the half sphere is secured between the first split ring and a second split ring to provide the electrical and mechanical connection between the bulb assembly and the solar receiver array.

2. The replaceable solar bulb assembly of claim 1, wherein the housing further comprises:
    a primary reflector having an open side for receiving the solar energy and defining an opening for receiving focused solar energy; and
    a secondary reflector for receiving solar energy reflected from the primary reflector and providing the focused solar energy on the opening of the primary reflector.

3. The replaceable solar bulb assembly of claim 2, further including a transparent cover enclosing the open side of the primary reflector and supporting the secondary reflector above a surface of the primary reflector.

4. The replaceable solar bulb assembly of claim 1, further comprising:
    a mounting plate for supporting the photovoltaic cell below the housing; and
    a heat sink connected to the mounting plate.

5. The replaceable solar bulb assembly of claim 4, wherein the at least one metal post further comprises a pair of metal posts for mechanically and electrically connecting the housing to the solar receiver array and electrically connecting the photo voltaic cell to the solar receiver array.

6. A solar receiver array comprising:
    a plurality of replaceable solar bulb assemblies for converting solar energy into an electrical signal;
    a plurality of support rails for supporting the plurality of replaceable assemblies in an X by Y array;
    electrical cables for receiving a plurality of generated electrical signals from each of the plurality of replaceable solar bulb assemblies;
    a plurality of docking connectors for connecting each of the plurality of replaceable solar bulb assemblies to one of the plurality of support rails; and
    wherein each of the plurality of replaceable solar bulb assemblies further comprising;
        a photo voltaic cell for converting solar energy into electrical energy;
        a housing including at least one reflector for containing the photo voltaic cell within the housing as a single removable unit and for focusing the solar energy on the photo voltaic cell;
    a connector for removably and mechanically connecting the single removable unit including the housing containing the photovoltaic cell to a docking connector of the plurality of docking connectors and electrically connecting the photo voltaic cell to the solar receiver array through the docking connector and the electrical cables, wherein the connector selectively connects the single replaceable solar bulb assembly to the solar receiver array independently of other replaceable solar bulb assemblies, the connector comprising:

at least one metal post extending from the housing having a first end connected to the housing and a second end, the second end defining a half sphere having a curved surface facing away from the housing and a second flat surface facing toward the housing; and a pair of split ring spring contacts, the first split ring spring contact opening to receive the second end of the metal post responsive to the half sphere pressing against the first split ring, wherein the half sphere is secured between the first split ring and a second split ring to provide the electrical and mechanical connection between the bulb assembly and the solar receiver array.

7. The system of claim 6, wherein the housing further comprises:

a primary reflector having an open side for receiving the solar energy and defining an opening for receiving focused solar energy; and a secondary reflector for receiving solar energy reflected from the primary reflector and providing the focused solar energy on the opening of the primary reflector.

8. The system of claim 7, further including a transparent cover enclosing the open side of the primary reflector and supporting the secondary reflector above a surface of the primary reflector.

9. The system of claim 6, further comprising:

a mounting plate for supporting the photovoltaic cell below the housing; and a heat sink connected to the mounting plate.

10. The system of claim 9, wherein the at least one metal post further comprises a pair of metal posts for and mechanically and electrically connecting the housing to the solar receiver array and electrically connecting the photo voltaic cell to the solar receiver array.

11. The system of claim 6, wherein the connectors further comprises a pair of connector blocks separated by a selected distance, wherein a portion of the primary reflector is received within the selected distance between the pair of connector blocks, each of the pair of connector blocks defining an opening for receiving the at least one metal post, the pair of connector blocks electrically and mechanically connecting the replaceable solar bulb assembly to the plurality of support rails.

12. The system of claim 11, wherein the pair of connector blocks provide the electrical signal from the replaceable solar bulb assembly to the electrical cables.

13. A single removable solar bulb assembly for installation in a solar receiver array including a plurality of replaceable solar bulb assemblies, comprising:

a photo voltaic cell for converting solar energy into electrical energy;

a primary reflector housing having an open side for receiving the solar energy and defining an opening for receiving focused solar energy;

a secondary reflector for receiving solar energy reflected from the primary reflector and providing the focused solar energy on the opening of the primary reflector;

a transparent cover enclosing the open side of the primary reflector and supporting the secondary reflector above a surface of the primary reflector;

a mounting plate for supporting the photovoltaic cell below the primary reflector housing;

a heat sink connected to the mounting plate;

a housing integrating the photovoltaic cell, the primary reflector, the secondary reflector, the transparent cover, the mounting plate and the heat sink into a single removable solar bulb assembly;

a connector for removably and mechanically connecting the single removable solar bulb assembly to the solar receiver array and electrically connecting the single removable solar bulb assembly to the solar receiver array, wherein the connector selectively connects the single removable solar bulb assembly to the solar receiver array independently of other removable solar bulb assemblies, the connector comprising:

at least one metal post extending from the housing having a first end connected to the housing and a second end, the second end defining a half sphere having a curved surface facing away from the housing and a second flat surface facing toward the housing; and a pair of split ring spring contacts, the first split ring spring contact opening to receive the second end of the metal post responsive to the half sphere pressing against the first split ring, wherein the half sphere is secured between the first split ring and a second split ring to provide the electrical and mechanical connection between the bulb assembly and the solar receiver array.

14. The replaceable solar bulb assembly of claim 13, wherein the at least one metal post further comprises a pair of metal connectors for and mechanically and electrically connecting the housing to the solar receiver array and electrically connecting the photo voltaic cell to the solar receiver array.

* * * * *